United States Patent
Reihlen et al.

(10) Patent No.: US 9,748,613 B2
(45) Date of Patent: *Aug. 29, 2017

(54) BATTERY CELL HAVING A TEMPERATURE SENSOR WHICH IS INTEGRATED IN THE BATTERY CELL HOUSING

(71) Applicants: Robert Bosch GmbH, Stuttgart (DE); Samsung SDI Co., Ltd., Yongin-si, Gyeonggi-do (KR)

(72) Inventors: Eckart Reihlen, Engels (RU); Jens Schneider, Leonberg (DE); Anne Heubner, Stuttgart (DE); Christian Pankiewitz, Stuttgart (DE); Fabian Henrici, Stuttgart (DE); Peter Fischer, Gerlingen (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 393 days.

This patent is subject to a terminal disclaimer.

(21) Appl. No.: 14/359,107

(22) PCT Filed: Nov. 12, 2012

(86) PCT No.: PCT/EP2012/072405
§ 371 (c)(1),
(2) Date: May 18, 2014

(87) PCT Pub. No.: WO2013/072281
PCT Pub. Date: May 23, 2013

(65) Prior Publication Data
US 2015/0037635 A1    Feb. 5, 2015

(30) Foreign Application Priority Data

Nov. 18, 2011   (DE) .................. 10 2011 086 616
Jun. 19, 2012   (DE) .................. 10 2012 210 263

(51) Int. Cl.
H01M 10/04    (2006.01)
H01M 10/42    (2006.01)
(Continued)

(52) U.S. Cl.
CPC .......... H01M 10/486 (2013.01); G01K 13/00 (2013.01); G01K 15/00 (2013.01); G01R 31/362 (2013.01);
(Continued)

(58) Field of Classification Search
CPC ............. H01M 2/202; H01M 10/0431; H01M 10/4207; H01M 10/4235; H01M 10/425;
(Continued)

(56) References Cited

U.S. PATENT DOCUMENTS

2005/0001596 A1 * 1/2005 Lovett ...................... G01K 1/02
                                                         320/150
2010/0109611 A1   5/2010 Schaefer et al.

FOREIGN PATENT DOCUMENTS

CN    101499544 A    8/2009
DE    199 61 311 A1   7/2001
(Continued)

OTHER PUBLICATIONS

English translation of WO Publication 2011-095355, Aug. 2011.*
(Continued)

*Primary Examiner* — Brittany Raymond
(74) *Attorney, Agent, or Firm* — Maginot, Moore & Beck LLP

(57) ABSTRACT

A lithium-ion battery cell includes a housing with an electrode arrangement and a temperature sensor that is arranged in the interior of the housing. The temperature sensor has an (Continued)

electro-thermal oscillator that converts a temperature into a frequency. A motor vehicle includes the lithium-ion battery cell.

19 Claims, 6 Drawing Sheets

(51) Int. Cl.
*H01M 10/48* (2006.01)
*H01M 2/20* (2006.01)
*G01R 31/36* (2006.01)
*G01K 13/00* (2006.01)
*G01K 15/00* (2006.01)

(52) U.S. Cl.
CPC ....... *H01M 2/202* (2013.01); *H01M 10/0431* (2013.01); *H01M 10/425* (2013.01); *H01M 10/4207* (2013.01); *H01M 10/4235* (2013.01); *H01M 10/4257* (2013.01); *H01M 10/482* (2013.01); *G01K 2205/00* (2013.01); *G01R 31/3658* (2013.01); *H01M 2010/4271* (2013.01); *H01M 2010/4278* (2013.01); *H01M 2200/10* (2013.01); *H01M 2220/20* (2013.01)

(58) Field of Classification Search
CPC ........... H01M 10/4257; H01M 10/482; H01M 10/486; H01M 2010/4271; H01M 2010/4278; H01M 2200/10; H01M 2220/20; G01R 31/362; G01R 31/3658; G01K 2205/00; G01K 13/00; G01K 15/00

See application file for complete search history.

(56) References Cited

FOREIGN PATENT DOCUMENTS

| | | |
|---|---|---|
| DE | 100 56 972 A1 | 5/2002 |
| EP | 0 477 908 A2 | 4/1992 |
| JP | 4 224730 B2 | 2/2009 |
| JP | 2009-109271 A | 5/2009 |
| WO | 2007/104325 A1 | 9/2007 |
| WO | 2011/095355 A2 | 8/2011 |
| WO | WO 2011-095355 * | 8/2011 |

OTHER PUBLICATIONS

International Search Report corresponding to PCT Application No. PCT/EP2012/072405, mailed Jul. 1, 2013 (German and English language document) (9 pages).

Makinwa et al; A CMOS Temperature-to-Frequency Converter With an Inaccuracy of Less Than ±0.5° C. (3σ) From -40° C. to 105° C.; IEEE Journal of Solid-State Circuits; Dec. 2006; pp. 2992-2997; vol. 41, Issue No. 12; IEEE (6 pages).

* cited by examiner

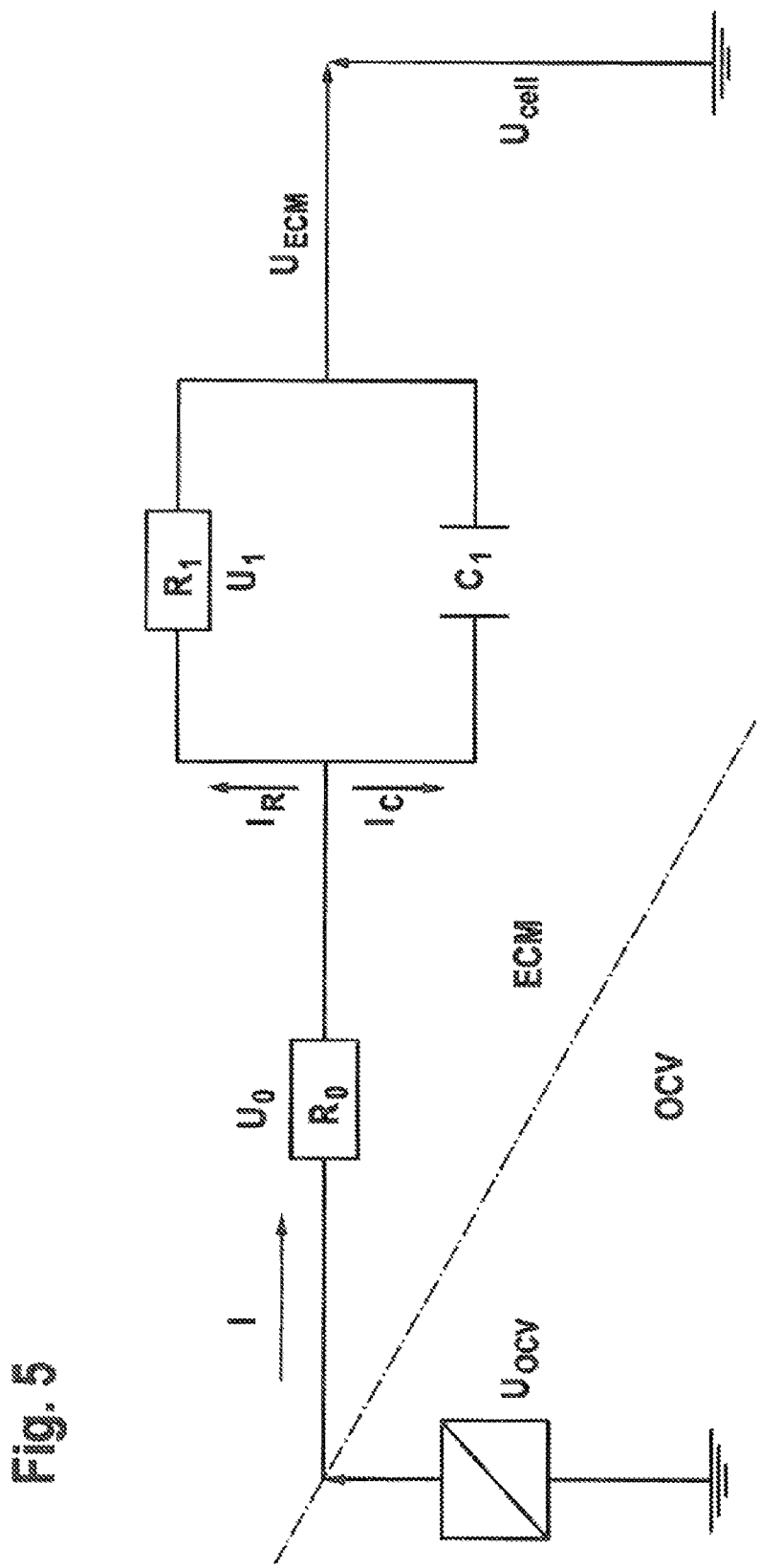

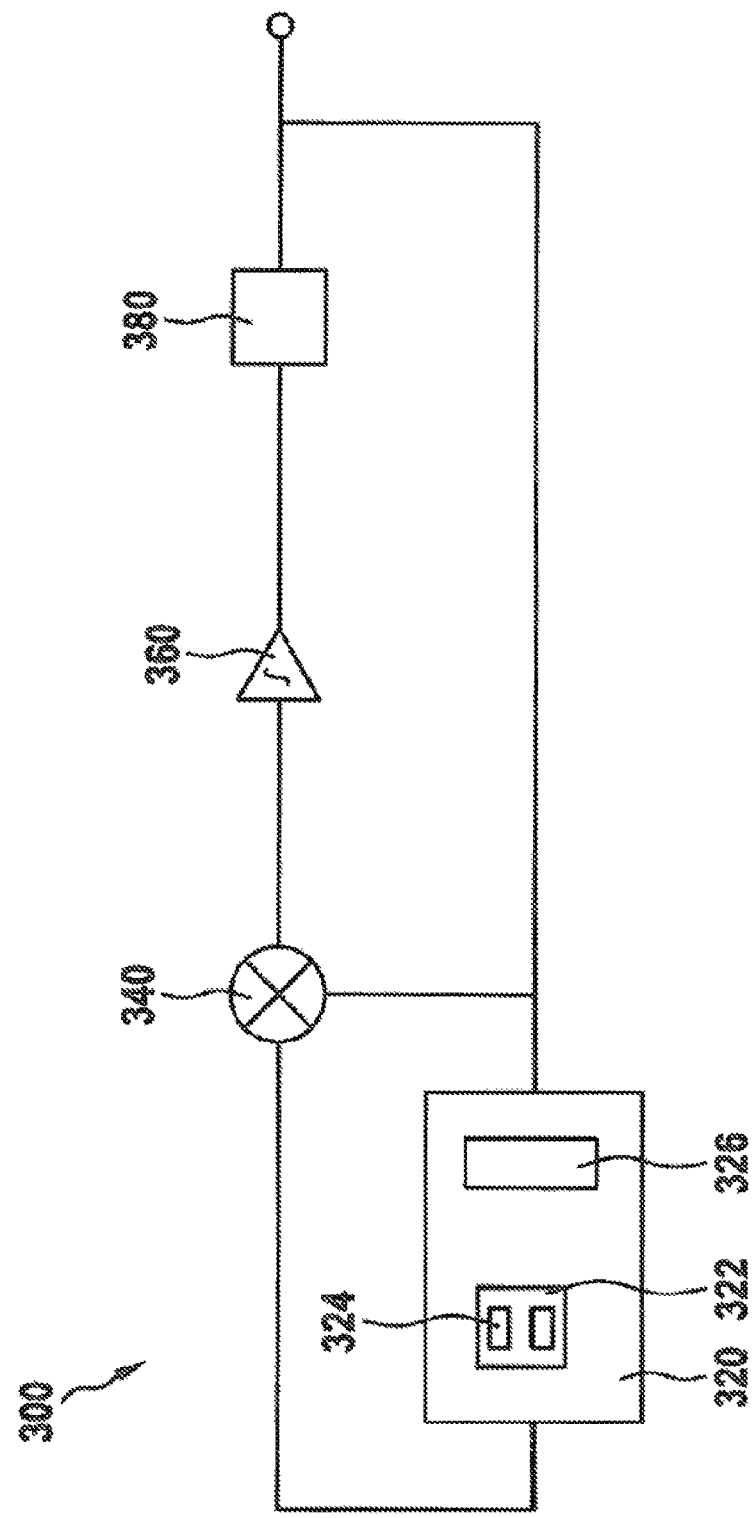

BATTERY CELL HAVING A TEMPERATURE SENSOR WHICH IS INTEGRATED IN THE BATTERY CELL HOUSING

This application is a 35 U.S.C. §371 National Stage Application of PCT/EP2012/072405, filed on Nov. 12, 2012, which claims the benefit of priority to Serial Nos. DE 10 2011 086 616.7 filed on Nov. 18, 2011, and DE 10 2012 210 263.9 filed on Jun. 19, 2012, both filed in Germany, the disclosures of which are incorporated herein by reference in their entirety.

BACKGROUND

The present disclosure relates to a battery cell, preferably a lithium ion battery cell, having a temperature sensor that is arranged in the battery cell housing.

It is apparent that in future both in stationary applications and also in vehicles such as hybrid vehicles and electric vehicles that battery systems will be used on an ever increasing scale. In particular, increasing use will be made of batteries as traction batteries for use in hybrid vehicles and electric vehicles and thus supplying energy to electric drives. FIG. 1 illustrates a battery 200 of this type of the prior art. Said battery comprises a housing 70 and a cell core that comprises an electrode arrangement 10 for generating energy. Mathematical battery models are used for the purpose of operating the battery 200. However, internal resistances and time constants of the dynamic battery cell behavior under load greatly depend upon the temperature in the cell core in which the chemical reactions occur. The temperature in the cell core can change rapidly as a result of the heat that is produced under load. FIG. 2 illustrates by way of example the instantaneous portion of the internal resistance of a 20 Ah battery cell plotted against the temperature. As is evident, the internal resistance undergoes high rates of change particularly in the low temperature range. An incorrectly measured temperature consequently has great influence on the battery states that are determined therefrom and also on the working capacity of the battery that is predicted from said measured temperature.

According to the prior art, the temperature is measured at the battery cells by means of temperature sensors that are attached to the housing. DE 199 61 311 A1 thus discloses a temperature sensor that is fastened to the battery from the outside by means of a battery clamp. The temperature-dependent battery model parameters are then mapped offline or online onto the housing temperature. However, the housing outer temperature corresponds neither to the core temperature inside the housing on the electrode arrangement nor is said housing outer temperature unambiguously associated with said core temperature. Consequently, the measurement of a change of core temperature on the battery cell housing owing to thermal transition resistances inside the cell and towards the outside is delayed or said change is not measured at all.

The inaccurate measurement of the prevailing temperature in the cell core consequently leads to inaccuracies in the temperature-dependent battery models of the operating state of the battery. The battery models can be used both in the battery control device for monitoring and controlling the operation of the battery and also outside the battery in an offline simulation.

DE 100 56 972 A1 discloses a battery cell, wherein sensors are arranged in the housing of a battery cell for the purpose of ascertaining the battery temperature. The temperature sensors are embodied as temperature detectors and are connected to the outer region of the battery housing by way of electrical lines. Although it is possible to ascertain the temperature of the cell core by means of installing conventional sensing elements inside the battery cell, said conventional sensing elements containing for example an NTC measuring unit that has a conventional three dimensional structure, the heat development and the influences of heat in the battery are however influenced by the sensing units and evaluating units and the signal lines.

Moreover, Makinwa and Snoeij ("A CMOS Temperature-to-Frequency Converter With an Inaccuracy of Less Than +−0.5° C. (3σ) from −40° C. to 105° C.", K. A. A. Makinwa, Martijn F. Snoeij, IEEE Journal of Solid-State Circuits, Vol. 41, No. 12, December 2006, p. 2992-2997) disclose a temperature-to-frequency converter that is implemented in a standard CMOS method.

SUMMARY

In accordance with the disclosure, a battery cell preferably a lithium ion battery cell is provided that comprises a housing, in which an electrode arrangement is arranged, and a temperature sensor that is arranged inside the housing. The temperature sensor comprises an electro thermal oscillator that converts a temperature into a frequency.

The battery cell in accordance with the disclosure has the advantage that temperatures can be ascertained at the site where the chemical reactions occur, in other words inside the battery cell housing without influencing the heat development and temperature as a result of the signal lines, sensing units or evaluating units. In addition, by virtue of ascertaining the housing inner temperature, it is possible to obtain a more accurate parameter for a battery model and to evaluate said parameter for the purpose of simulation and also for recognizing the state and for prediction purposes.

The temperature sensor is preferably embodied as a differential temperature sensor. The disclosure renders it possible to ascertain in a dynamic manner temperature changes in the cell (ΔT/dt). It is preferred that the dynamic values ΔT/dt lie between 0.5 K/min and 5 K/min.

It is preferred that the temperature sensor is integrated in an integrated circuit in a microchip. Owing to the fact that said sensor can be integrated inside the housing, it is possible to achieve a small structure that is cost-effective and robust with respect to influences from the outside.

It is preferred that the temperature sensor comprises a CMOS oscillator, in other words a thermal oscillator that is achieved in an integrated circuit using the CMOS technology. In the case of complementary metal oxide semiconductors (CMOS), both the p-channel and also the n-channel field effect transistors are used on a common substrate. The advantage of this construction is that it can be integrated directly into an application-specific integrated circuit (ASIC) and provides a temperature-proportional frequency signal.

It is preferred that the electro thermal oscillator comprises a thermocouple pile having thermal elements. Thermal elements have the advantage in comparison to transistors that they are not offset and are free of 1/f noises.

In a different embodiment, the temperature sensor comprises a temperature dependent bipolar transistor. In other words, the disclosure comprises temperature sensors that are integrated in a microchip, said temperature sensors being on the basis of the silicon diode characteristic curve being dependent upon the temperature, such as for example band gap temperature sensors. It is also possible in this case to integrate the temperature sensor directly in an application-specific integrated circuit (ASIC).

The quasi digital output signal of the temperature sensor is guided in one embodiment of the disclosure out of the housing by means of the current line communication.

As a consequence, the sensor can be integrated into a cell without having to provide additional current lines to the outside through the housing wall. Alternatively, it is also possible to use a method that is based on bipolar technology, such as for example band gaps, CTAT (current generator complementary to absolute temperature), PTAT (current generator proportional to absolute temperature) or a method that is based on a simple diode. The output signal, preferably the voltage, can be converted in an expedient manner, in other words it can be digitized.

It is preferred that the electrode arrangement comprises a winding of a first electrode and a winding of a second electrode with a separator provided between the two, and the temperature sensor is arranged in one embodiment directly on the winding.

It is preferred that the electrode arrangement is connected to at least one current collector that directs the current from the electrode arrangement out of the housing, and it is preferred that the temperature sensor is thermally coupled to the current collector, it is even more preferred that the temperature sensor is arranged directly on the at least one current collector. The temperature sensor is electrically connected in a preferred embodiment of the disclosure to the electrode arrangement for the purpose of being supplied with energy. Since the current collector is coupled directly to the cell winding and taps the current from the electrode arrangement, the temperature sensor can directly ascertain the temperature at the cell winding and simultaneously draw the current for its operation from the cell winding.

Moreover, a motor vehicle having a battery cell in accordance with the disclosure is proposed, wherein the battery cell is connected to the drive of the motor vehicle.

Advantageous further developments of the disclosure are disclosed in the subordinate claims and described in the description.

BRIEF DESCRIPTION OF THE DRAWINGS

Exemplary embodiments of the disclosure are further described with reference to the drawings and the description hereinunder, in which:

FIG. 5 illustrates a battery cell model in accordance with the disclosure with an alternative circuit diagram, and FIG. 6 illustrates an embodiment of a thermal oscillator.

DETAILED DESCRIPTION

Figure 1:
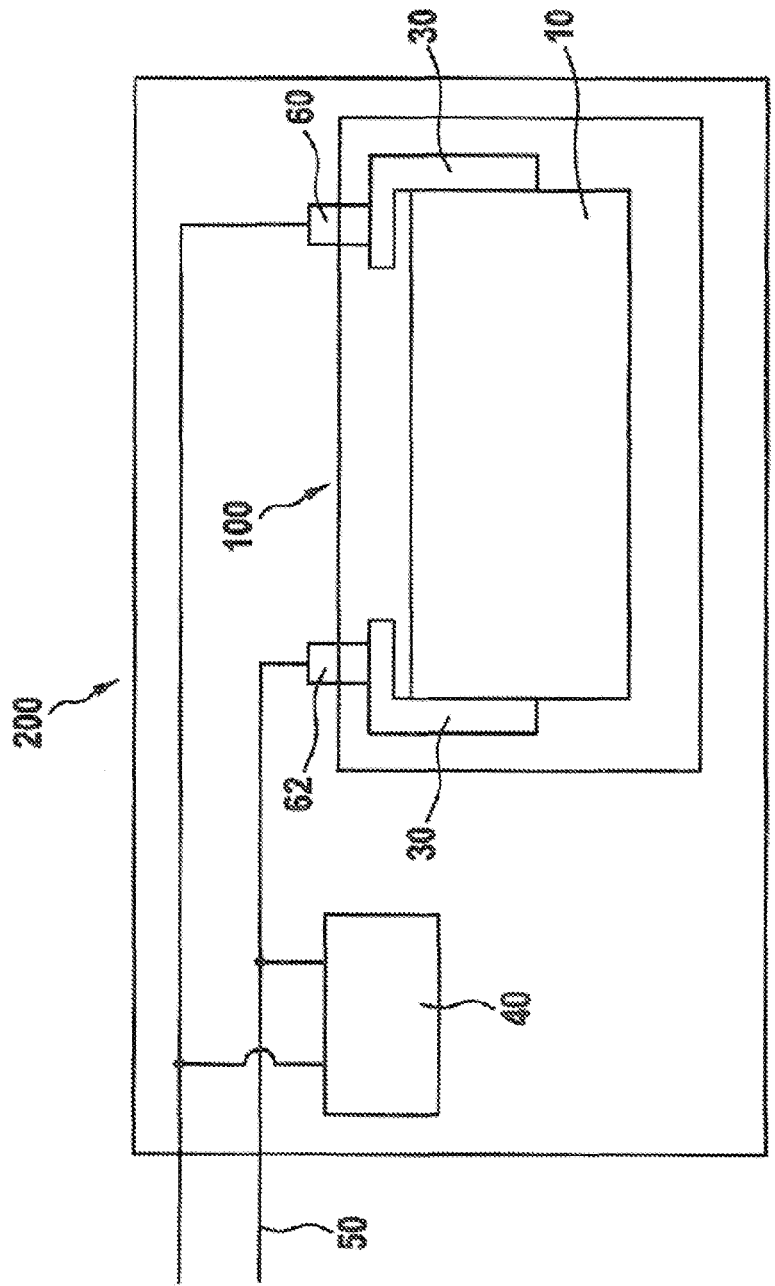
FIG. 1 illustrates a battery of the prior art.
Figure 2:
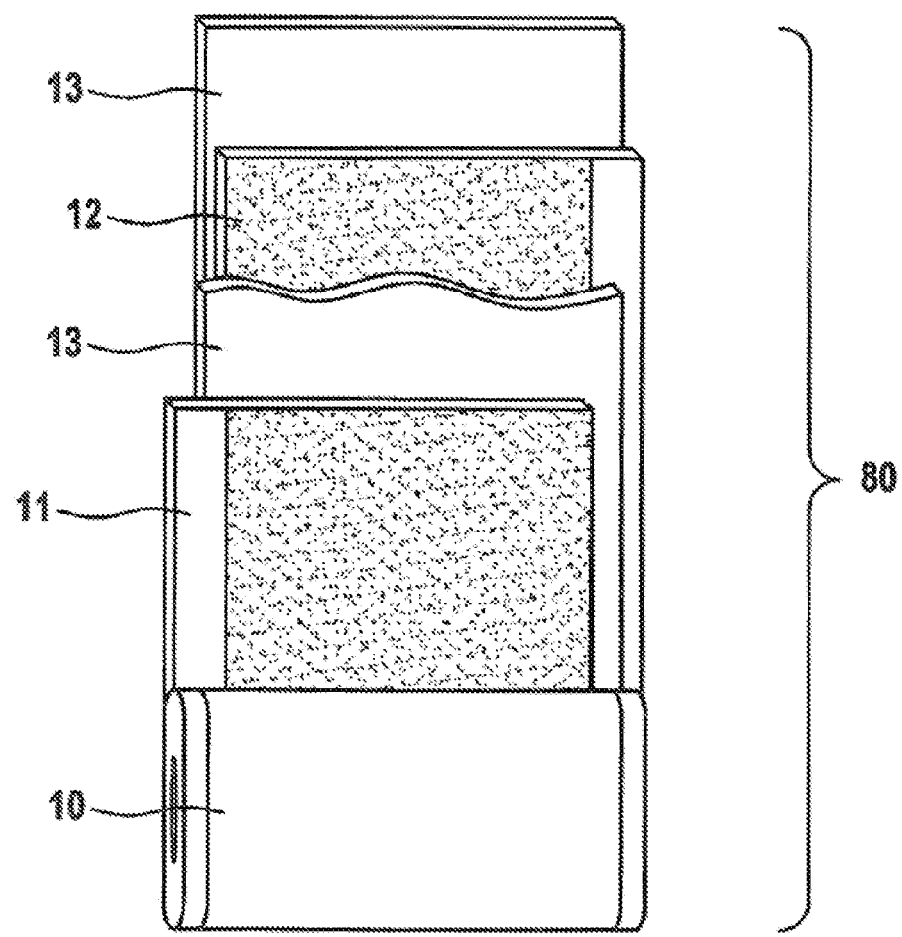
FIG. 2 illustrates a wound electrode arrangement of the prior art.

FIG. 1 illustrates a battery 200 of the prior art. The battery 200 comprises a battery control device 40 and a battery cell 100 having a housing 70. Arranged inside the housing 70 is a cell core, an electrode arrangement 10. The electrode arrangement 10 comprises a first, positive electrode 11, and a second negative electrode 12 (cf. FIG. 2), which are separated by a separator 13. The electrodes 11, 12 are preferably wound with the separator 13 provided between the two electrodes, as illustrated in FIG. 2. Current collectors 30 make contact with the electrode arrangement 10 on two opposite lying sides. The one current collector 30 makes contact with the first electrode 11, the second current collector 30 contacts the second electrode 12. The current collectors 30 are connected to a first terminal 60 and a second terminal 62. The terminals 60, 62 convey the current out of the housing 70 of the battery cell 100. The battery control device 40 is connected to the terminals 60, 62 of the battery cell 100 by way of electrical connecting lines 50. The battery control device 40 controls the operation of the battery 200, for example charging procedures and discharging procedures. A battery model is preferably implemented in the battery control device 40. Said battery model is used to monitor the battery 200.

Figure 3:
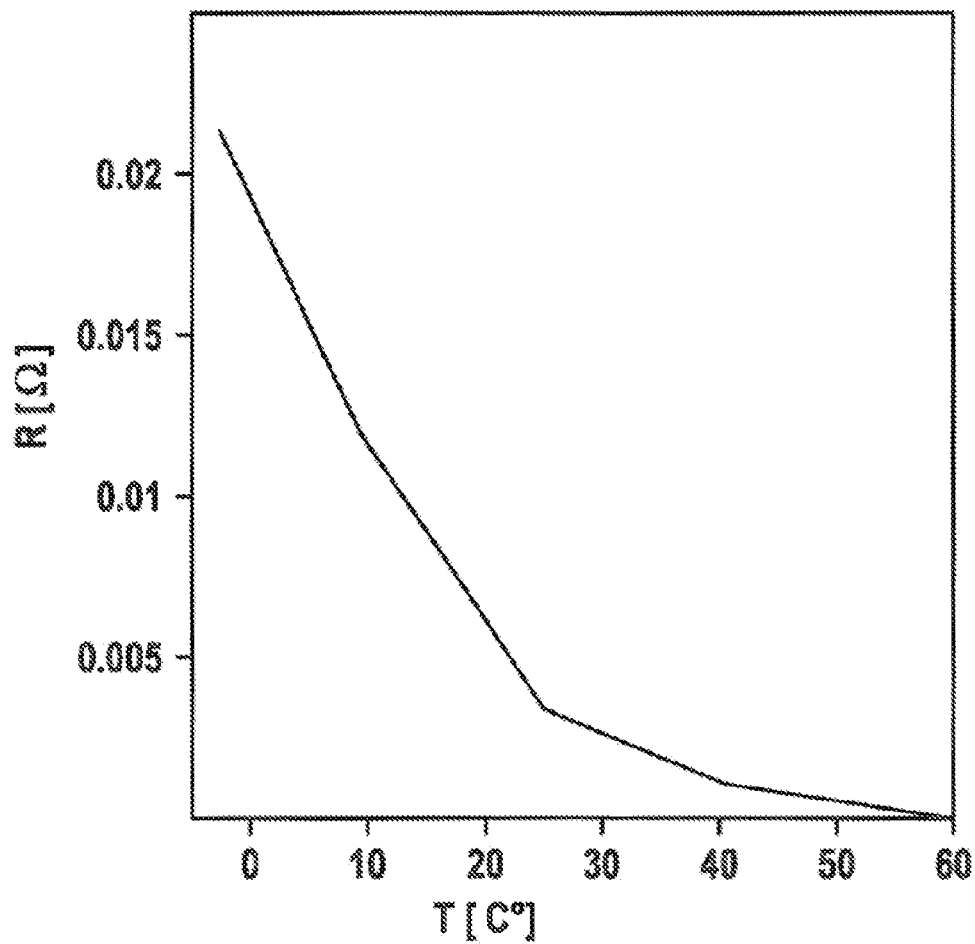
FIG. 3 illustrates the graph of the instantaneous portion of the battery internal resistance plotted against the temperature.

FIG. 3 illustrates the instantaneous portion of the cell internal resistance in dependence upon the temperature inside the cell. The curve demonstrates high rates of change particularly in the region of less than 20° C. As the temperature rises, the resistance value of the battery cell 100 falls. In other words, if the temperature is measured outside on the housing, then the temperature value is frequently 5 K less than inside the housing and also does not demonstrate a rise in temperature inside the housing until considerably later. This then leads to an error when ascertaining the resistance values in the battery model and consequently an error when calculating the battery voltage, as mentioned in the introduction.

Figure 4:
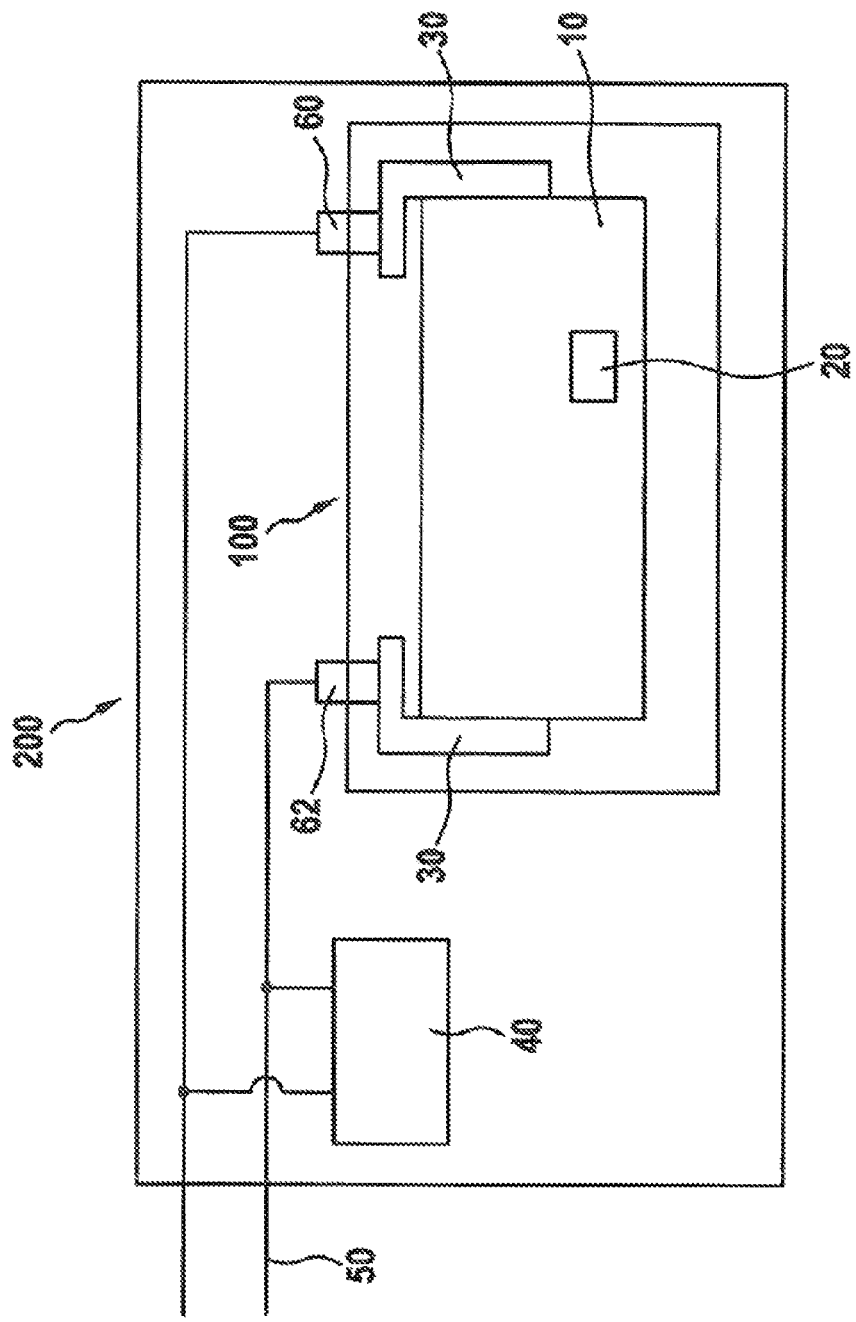
FIG. 4 illustrates a battery in accordance with the disclosure having a battery cell and a temperature sensor inside the battery cell housing.

FIG. 4 illustrates a battery 200 in accordance with the disclosure. Said battery corresponds substantially to the construction of the battery 200 in the prior art illustrated in FIG. 1, however this battery comprises a temperature sensor 20 inside the battery cell 100.

The temperature sensor 20 converts temperatures into frequencies, in other words provides a temperature-proportional frequency signal. Said temperature sensor comprises a thermal oscillator preferably, but not limiting, a thermal oscillator that is integrated by means of CMOS technology on a microchip in an application-specific integrated circuit.

It is preferred that the thermal oscillator is a CMOS temperature-to-frequency converter, as disclosed by Makinwa and Snoeij ("A CMOS Temperature-to-Frequency Converter With an Inaccuracy of Less Than +−0.5° C. (3σ) from −40° C. to 105° C.", K. A. A. Makinwa, Martijn F. Snoeij, IEEE Journal of Solid-State Circuits, Vol. 41, No. 12, December 2006, p. 2992-2997).

It is possible in an advantageous manner to direct the quasi digital output signal by virtue of this construction in a simple manner by way of already existing current paths to the outside from the battery housing. It is not necessary to provide additional feedthroughs for the current lines through the housing.

Alternatively, however, it is also possible to use a method that is based on bipolar technology. The output signal preferably the voltage can then be expediently converted, in other words digitized.

It is particular expedient by way of example to place the temperature sensor 20 directly on the cell winding 10, as illustrated in FIG. 4. The electrode temperature can then be directly measured and simultaneously the temperature sensor 20 can be supplied with current. Said temperature sensor is then electrically connected to the first electrode and the second electrode.

In a further embodiment, the temperature sensor 20 can also be placed directly on at least one of the current collectors 30 of the cell winding. The current collectors 30 generally comprise a high level of thermal conductivity, are embodied from metal and can thus easily transmit the cell winding temperature to the temperature sensor 20.

The temperature sensor 20 inside the housing 70 can also be supplied with current from outside by way of the terminals 60, 62.

The measured temperature is preferably uploaded as a modulated signal to the prevailing current line path (terminal-current collector-electrode arrangement) inside the battery. The temperature can then be transmitted from there to the battery control device 40 by way of current lines 50. The temperature information can be directed out of the housing 70 in a capacitive and inductive manner by means of coupling the oscillations of the temperature sensor 20 to the current line paths. The oscillations are then uncoupled outside the battery cell 100 using means for uncoupling oscillations (not illustrated) and are used in the battery control device 40 in the battery module that is implemented there.

This can also occur online, in other words during the operation of the battery cell 100 but also offline while the battery cell 100 is not in use. In the latter case, the temperature sensor 20 is then influenced from outside with energy.

A cell model that is adapted and parameterized to the respective type of battery cell 100 is used in the battery control device 40. The measured current normally flows at the measured temperature as an input variable into this model that simulates the voltage resulting from said input variable and compares said voltage with the measured voltage in order to adjust model parameters, to ascertain the charge state, provide predictions for the current or power and much more.

If the measured temperature value in accordance with the disclosure from the cell core is used either online or offline, preferably in both, it is possible to significantly improve and predict the calculation of the dynamic behavior of the cell.

In one exemplary embodiment, an equivalent switching circuit (ECM—"equivalent circuit model") is implemented in the battery control device 40 with an ohmic resistance and an RC element as illustrated in FIG. 5.

The equivalent switching circuit comprises the idling voltage $U_{OCV}$, the battery cell voltage $U_{cell}$, a first resistance $R_0$ as an ohmic resistance to which is connected in series a parallel connection of a second resistance $R_1$ and a capacitor $C_1$. The current I flows through the first resistance $R_0$, divides into a current $I_R$, which flows by way of the second resistance $R_1$, and a current $I_c$ which flows by way of the capacitor $C_1$. The voltage $U_1$ drops by way of the first resistance $R_1$. The voltage of the battery cell 100 is then calculated by means of:

$$U_{cell} = U_{OCV} + R_0 \cdot I_{cell} + U_1 \quad \text{(Equation 1)}$$

wherein $U_1$ having a suitable initial condition $U^1_0$ is the solution of the differential equation:

$$\dot{U}_1 = -\frac{1}{R_1 C_1} U_1 + \frac{1}{C_1} \cdot I_{cell} \quad \text{(Equation 2)}$$

The following explicit relationship is then produced for a constant current pulse from t=0:

$$U_{cell}(t) = U_{OCV}(t) + U^0_1 e^{-\frac{t}{R_1 C_2}} + I_{cell}(t) \cdot R_0 + I_{cell}(t) \cdot R_1 \cdot \left(1 - e^{-\frac{t}{R_1 C_2}}\right) \quad \text{(Equation 3)}$$

If it is assumed that the temperature measurement on the housing demonstrates by way of example only 5 Kelvin less than the temperature that is actually prevailing in the battery cell inside, then as a consequence the resistance values $R_0$, $R_1$ increase by 20% with respect to the actual values. However, the time constants $R_1 C_1$ remain constant.

The point in time up to which the magnitude of a voltage drop in the battery 200 exceeds a specific threshold is of interest for predicting a constant current availability. The relationship applies:

$$\left| I_{cell}(t) \cdot R_0 + I_{cell}(t) \cdot R_1 \cdot \left(1 - e^{-\frac{t}{R_1 C_1}}\right) \right| \geq U_S \quad \text{(Equation 4)}$$

If the higher temperature that is measured on the housing is used, the value on the left-hand side of the equation 4 is at any point in time 20% higher than necessary, and the available time for using the constant current will be constantly output too low.

However, if, instead of this, the temperature that is measured in the cell core is used, the current prediction is more accurate, and the capacity of the battery is exhausted more efficiently. This also applies for estimating the state, predicting the capacity and simulating offline the behaviour of the battery cell 100.

The battery control device in accordance with the disclosure 40 is designed by way of the battery cell module so as to receive the battery cell temperature that is measured directly inside the housing, and to ascertain the resistances, for example with the aid of a table that is stored in the battery control device 40, in dependence upon the temperature that is measured directly inside the housing. As a consequence, the accuracy of the battery module is improved in comparison to the temperature that is measured in the prior art on the outside of the housing.

FIG. 6 illustrates an exemplary embodiment of a thermal oscillator 300 that is used in the disclosure. The thermal oscillator 300 comprises an electro thermal filter 320 having a heating element 326 and a thermocouple pile 322 that comprises different thermal elements 324. The thermal elements 324 are embodied as thin layer structures. They can by way of example be p+ diffusion/aluminium thermal elements 324. The advantage of thermal elements 324 in comparison to transistors or resistances is that they are not offset and are free of 1/f noises. Moreover, the thermal oscillator comprises a multiplier 340, an integrator 360 and a voltage-controlled oscillator 380. The thermocouple pile 320, the heating element 326 and the voltage-controlled oscillator 380 are connected by way of a feedback loop to the multiplier. The phase offset of the electro thermal filter 320 ascertains as a result of this the frequency of the voltage-controlled oscillator 380. The phase offset of the electro thermal filter 320 arises as a result of the delay between the thermal pulse (temporary increase in temperature) being generated at the heating element 326 and said pulse being recognized and/or converted back into a voltage pulse at the thermocouple pile 322. This phase offset is dependent upon the basic temperature of the substrate on which the thermal oscillator is arranged, said oscillator in turn adopting the temperature of the environment. As a consequence, the oscillating frequency of the thermal oscillator 300 is dependent upon the temperature of the battery cell 100.

The invention claimed is:

1. A battery cell, comprising:
a housing including an electrode arrangement; and
a temperature sensor arranged inside the housing, the temperature sensor including an electro thermal oscillator that converts a temperature into a frequency,
wherein the temperature sensor comprises a dynamic temperature rate between 0.5 K/min and 5 K/min.

2. The battery cell as claimed in claim 1, wherein the temperature sensor is a differential temperature sensor.

3. The battery cell as claimed in claim 1, wherein the temperature sensor is integrated in an integrated circuit in a microchip.

4. The battery cell as claimed in claim 1, wherein the temperature sensor comprises a CMOS oscillator.

5. The battery cell as claimed in claim 4, wherein the electro thermal oscillator comprises a thermocouple pile having thermal elements.

6. The battery cell as claimed in claim 1, wherein the temperature sensor comprises a temperature-dependent bipolar transistor.

7. The battery cell as claimed in claim 1, wherein the electrode arrangement comprises a winding of a first electrode and a winding of a second electrode with a separator between the two, and wherein the temperature sensor is arranged on the winding.

8. The battery cell as claimed in claim 7, wherein the temperature sensor is arranged directly on one of the winding of the first electrode and the winding of the second electrode.

9. The battery cell as claimed in claim 1, wherein the electrode arrangement is connected to at least one current collector that directs the current from the electrode arrangement out of the housing, and wherein the temperature sensor is thermally coupled to the current collector.

10. The battery cell as claimed in claim 9, wherein the temperature sensor is arranged directly on the at least one current collector.

11. The battery cell as claimed in claim 1, wherein an output signal of the temperature sensor is directed by a current line communication out of the housing.

12. The battery cell as claimed in claim 1, wherein the temperature sensor is electrically connected to the electrode arrangement and configured to be supplied with energy therefrom.

13. A motor vehicle, comprising:
a battery cell including:
a housing including an electrode arrangement; and
a temperature sensor arranged inside the housing, the temperature sensor including an electro thermal oscillator that converts a temperature into a frequency, wherein the battery cell is connected to the drive of the motor vehicle,
wherein the temperature sensor comprises a dynamic temperature rate between 0.5 K/min and 5 K/min.

14. A battery cell, comprising:
a housing including an electrode arrangement; and
a temperature sensor arranged inside the housing, the temperature sensor including an electro thermal oscillator that converts a temperature into a frequency,
wherein an output signal of the temperature sensor is directed by a current line communication out of the housing.

15. The battery cell as claimed in claim 14, wherein:
the electrode arrangement includes a winding of a first electrode and a winding of a second electrode with a separator between the two, and
the temperature sensor is arranged on one of the winding of the first electrode and the winding of the second electrode.

16. The battery cell as claimed in claim 14, wherein the temperature sensor is a differential temperature sensor.

17. The battery cell as claimed in claim 14, wherein the temperature sensor comprises a dynamic temperature rate between 0.5 K/min and 5 K/min.

18. The battery cell as claimed in claim 14, wherein the temperature sensor is integrated in an integrated circuit in a microchip.

19. The battery cell as claimed in claim 14, wherein the electro thermal oscillator comprises a thermocouple pile having thermal elements.

* * * * *